United States Patent [19]

Faust et al.

[11] 4,426,775

[45] Jan. 24, 1984

[54] METHOD FOR THE PRODUCTION OF CONDUCTOR TRACKS APPLIED TO A SUPPORT

[75] Inventors: Wolfgang Faust, Hofheim; Friedrich W. Nickol, Eppstein; Holm Baeger, Schwalbach, all of Fed. Rep. of Germany

[73] Assignee: VDO Adolf Schindling AG, Frankfurt am Main, Fed. Rep. of Germany

[21] Appl. No.: 278,247

[22] Filed: Jun. 29, 1981

[30] Foreign Application Priority Data

Jun. 17, 1980 [DE] Fed. Rep. of Germany ....... 3024213

[51] Int. Cl.³ .............................................. H05K 3/10
[52] U.S. Cl. .................................... 29/846; 29/592 R
[58] Field of Search ................. 29/846, 851, 847, 840, 29/848, 832, 592 R; 174/68.5

[56] References Cited

U.S. PATENT DOCUMENTS

| | | | |
|---|---|---|---|
| 3,518,751 | 7/1970 | Waters et al. | 174/68.5 X |
| 3,606,679 | 9/1971 | Schroeder | 29/832 |
| 3,615,949 | 10/1971 | Hicks | 174/68.5 X |
| 3,812,019 | 5/1974 | Needham et al. | 174/68.5 X |
| 3,835,530 | 9/1974 | Kilby | 29/832 X |
| 3,902,003 | 8/1975 | Wheeler et al. | 174/68.5 |
| 3,902,790 | 9/1975 | Hsieh et al. | 174/68.5 X |
| 3,928,658 | 12/1975 | Van Boxtiel | 29/847 X |
| 4,000,054 | 12/1976 | Marcantonio | 174/68.5 X |
| 4,024,631 | 5/1977 | Castillero | 29/847 |
| 4,289,384 | 9/1981 | Samek | 174/68.5 X |
| 4,296,272 | 10/1981 | Schelhorn | 174/68.5 |

OTHER PUBLICATIONS

Thin Solid Films, vol. 13, No. 1, p. 51FF (1972).

*Primary Examiner*—Howard N. Goldberg
*Assistant Examiner*—Carl J. Arbes
*Attorney, Agent, or Firm*—Martin A. Farber

[57] ABSTRACT

A method of producing conductor tracks applied to a support, particularly conductor tracks applied on an electrode support of a liquid-crystal display, in which a mask having cutouts corresponding to the conductor tracks is placed on the support and a conductive layer of electrically conductive material is applied corresponding to the cutouts to the support by, for instance, vapor deposition or sputtering. The cutouts are so interrupted at given points by support webs that the mask is imparted a mechanically stable shape in its plane, and that interruptions in the conductor paths are caused by the support webs. This occurs upon the application of the conductor layer of electrically conductive material, partially forming the conductor tracks on the support with interruptions in the conductor tracks masked by the support webs in a first operation by applying the conductive layer of electrically conductive material through the openings of the mask onto the support.

16 Claims, 6 Drawing Figures

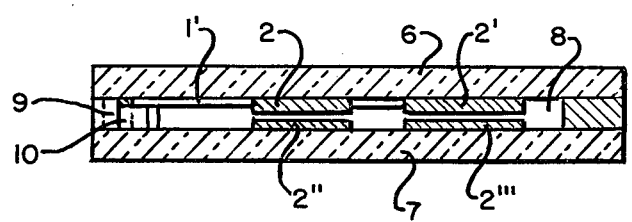
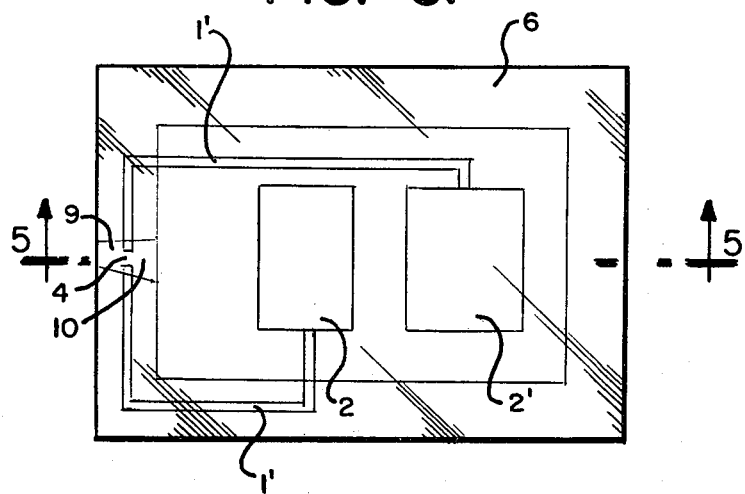

METHOD FOR THE PRODUCTION OF CONDUCTOR TRACKS APPLIED TO A SUPPORT

The present invention relates to a method of producing conductor paths applied to a support, particularly conductor paths applied on an electrode support of a liquid-crystal display, in which a mask having cutouts corresponding to the conductor paths is placed on the support and a conductive layer of electrically conductive material is applied, corresponding to the cutouts, to the support by, for instance, vapor deposition or sputtering.

Upon the application of conductor paths to a support by means of a mask, the problem arises in the case of complicated masks having a large number of cutouts that the mask is so unstable that even if it lies on a flat surface it does not remain in its desired shape and the individual parts of the mask shift with respect to each other. It may even happen in this connection that parts of the mask shift so much with respect to each other that there is an at least partial overlapping of cutouts which in themselves are separate and thus there is contact between conductor paths which are actually to be produced separately when the electrically conductive conductor layer is applied. Similarly it may result from such displacement that a conductor path which should be continuous is interrupted by being covered by a mask part. The danger which leads to such problems is particularly great when an inner region of conductor paths is substantially enclosed by one or more ring lines extending parallel thereto. Thus the mask has no self-supporting mechanical stability.

The danger is particularly great in the case of closed ring conductor paths since they result in mask parts which are separate from each other.

These problems are present, for instance, in liquid-crystal displays in which the individual lead wires which lead to the integrated circuit units arranged in the region of the edge of the electrode supports are developed as ring lines which extend closely parallel to each other.

It is therefore the object of the invention to provide a method in accordance with the preamble of the specification by which a correct application of the conductor paths to the support is assured in a simple manner.

In accordance with the invention, the cutouts are so interrupted at given points by support webs that the mask is imparted a mechanically stable shape in its plane and that the interruptions (4) in the conductor paths (1') which are caused by the support webs upon the application of the conductor layer of electrically conductive material are bridged over in a second operation by the application of electrically conductive material. By the support webs the result is obtained, on the one hand, that even though the surface of the masks is provided extensively with cutouts which are of complicated course and extend closely alongside of each other, the masks retain a completely stable invariable contour when they are applied to the support. On the other hand an absolutely correct position of mask inner portions surrounded by a closed ringed cutout is obtained.

In one advantageous embodiment of the invention the mask bearing the cutouts corresponding to the conductor paths (1,1' is removed in the second operation and a mask having cutouts at the places of the interruptions (4) of the conductor paths is applied to the support and a layer of electrically conductive material placed on.

Thus the interruptions in the conductor paths produced in the first operation are bridged over in a simple manner.

If this method is employed in liquid-crystal displays, the bridged-over interruptions may also be in the region within the liquid-crystal cell since the height of this bridging point is less than the height of the inside of the liquid-crystal cell. A short-circuit from the electrode with the bridging points to the second electrode on the other side wall of the liquid-crystal cell is not possible.

If a non-solderable conductor layer of electrically conductive material has been applied in the first operation to the support, as in the case of liquid-crystal displays, then in the second operation a covering which leaves open the regions of the conductor paths (1') on both sides of the support webs can be placed on the mask, and a layer of solderable material applied, the interruptions (4) being connected together in electrically conductive manner by soldering after removal of mask and covering. If in this connection the leads of one or more integrated circuits are connected to the conductor paths it is advantageous that the covering leave open the regions of the conductor paths (1') to which the leads of the integrated circuits (3) can be connected and that integrated circuits (3) be applied after the second operation onto the support and their leads connected in electrically conductive manner by soldering to the associated conductor paths (1'). This type of manufacture can also be carried out in simple fashion.

If two spaced electrode supports of a liquid-crystal display are present on which there are arranged, opposite each other, associated electrodes which, upon assembly of the electrode supports provided with the conductor paths, are connected in electrically conductive manner with each other at a contact point, the interruptions of the conductor paths can be located at the contact-point places and the contact point can be produced by the application of conductive material in a thickness which corresponds to the distance between the electrode supports. In this connection the contact point may advantageously consist of an electrically conductive cement. In this embodiment of the method two functions are also performed in a single operation, namely both the electrically conductive connection between the electrodes is produced as well as the bridging over of the interruptions of the conductor path. The junctions leading from the conductor paths to the outside of the liquid-crystal-cell thus can be located all on one of the two electrode supports. The contact point leading from one electrode support to the other electrode support is the connection from the junction on one electrode support to the conductor path on the other electrode support.

In the case of two glass plates of a liquid crystal display which are spaced apart from each other and form a chamber with each other, the insides of the plates being provided with the conductor paths and forming the electrode supports, and the chamber having a filling opening for the introduction of the liquid crystal substance which opening is closed after the filling, the interruptions of the conductor paths can advantageously be arranged at the place of the filling opening and be bridged over by a filling-opening closure of electrically conductive material. In this method also two functions are performed in one operation, namely the closing of the filling opening and the bridging of the interruptions of the conductor paths.

In methods of manufacture in which the conductor paths are arranged on the electrode supports of a liquid crystal display it is advantageous for the integrated circuits (3) and/or the interruptions (4) to be arranged in the uncovered edge region of the electrode supports. In this way it is not disturbing if the bridgings are produced by a visible connection as, for instance, upon soldering, since in the field of view of the observer the conductor paths can be made of transparent material. This edge region remains open after the assembling of the liquid crystal cell, so that the chips of the integrated circuits as well as the soldering work can be carried out unimpeded. Furthermore, no problems arise due to the relatively large thickness of the chips and solder connections as compared with the small height of the liquid crystal chamber.

Various embodiments of the invention are shown in the drawing and will be described in detail below.

FIGS. 5 and 6 show respectively a sectional view and an inside plan view of a liquid crystal display the sectional view of FIG. 5 being taken along the line 5—5 of FIG. 6.

The electrode supports shown in the figures are provided with conductor paths 1, 1' which lead to the electrodes 2, 2'. The electrodes 2 form a circular speed indicator while the electrodes 2' form an odometer.

The electrodes 2 and 2' are connected via the conductor tracks 1 to integrated circuits 3 formed as chips arranged in the edge region of the electrode support.

The conductor paths 1' form ring lines which extend along the edge of the electrode support and are the feed lines for the integrated circuits 3. These conductor paths 1' extend, forming approximately a "U"along three sides of the rectangular electrode support.

Figure 1:
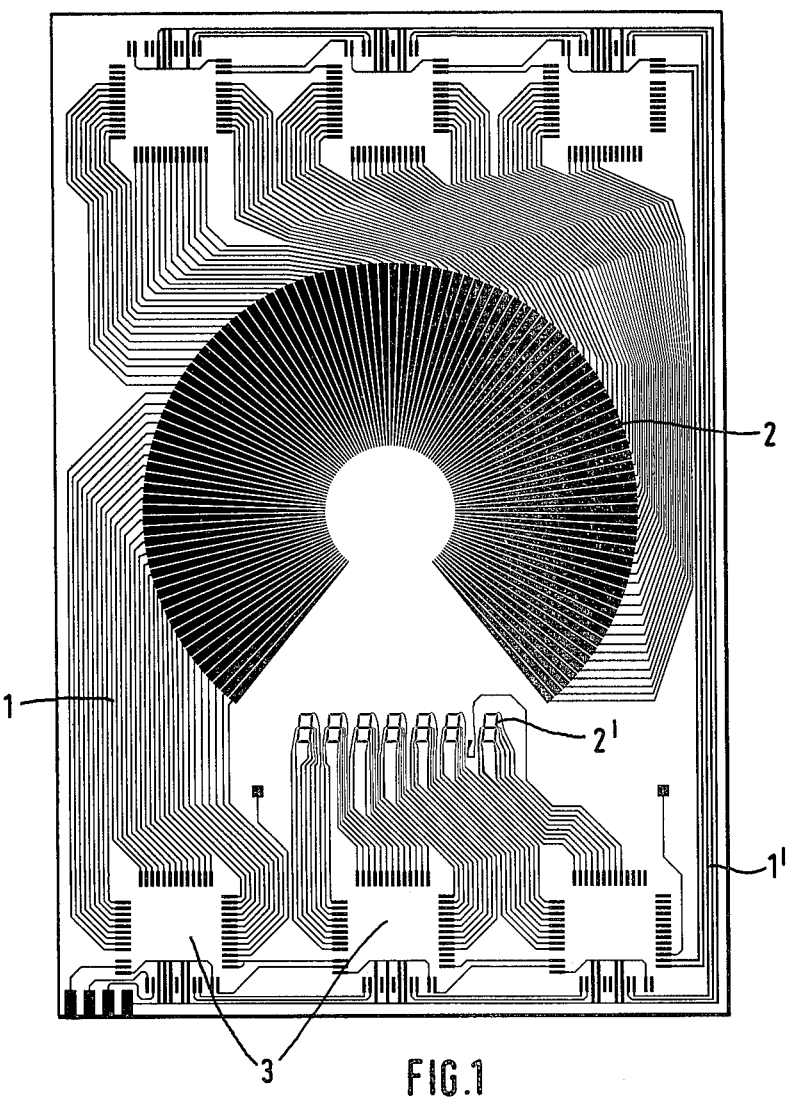
FIG. 1 shows an electrode support for a liquid-crystal display in two operations with completely applied conductor paths (tracks).
Figure 2:
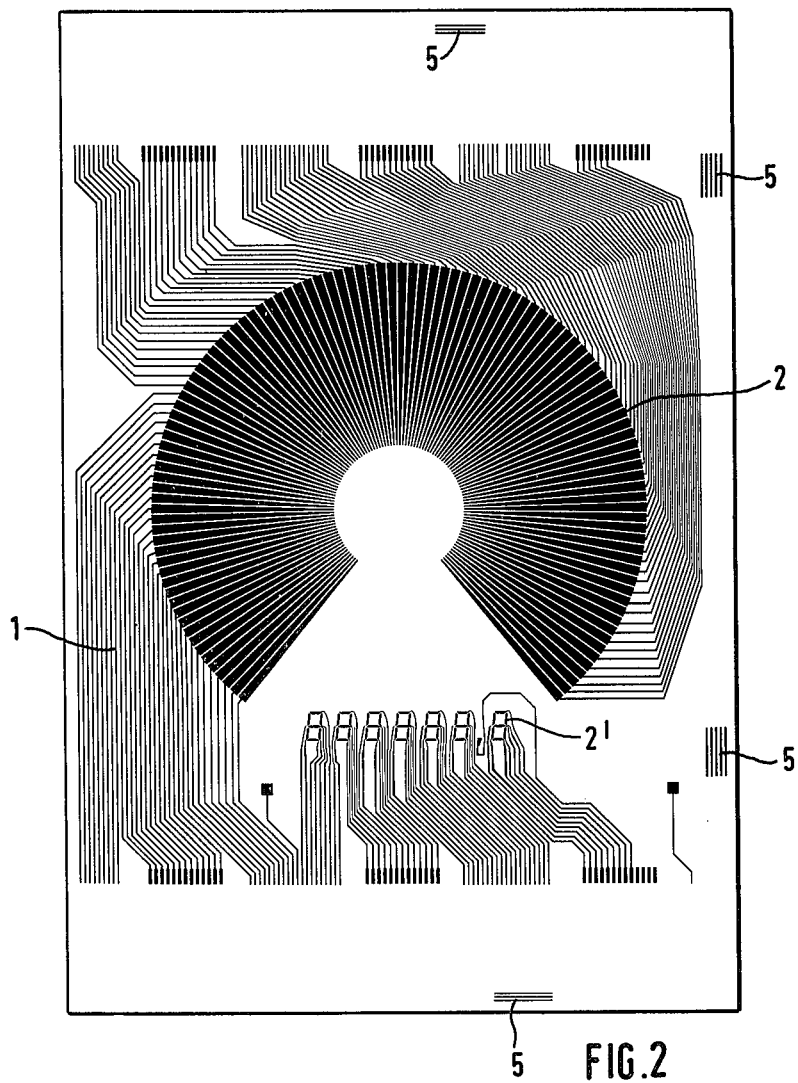
FIG. 2 shows the electrode support of FIG. 1 with the conductor paths applied in the first operation.
Figure 3:
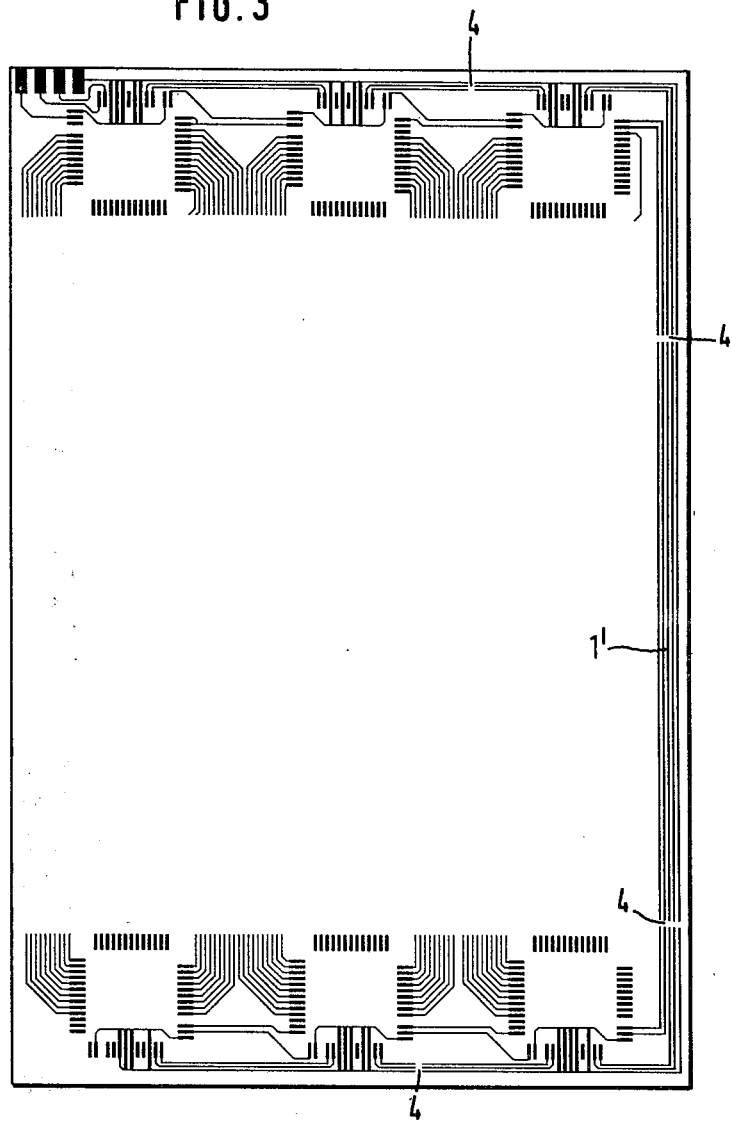
FIG. 3 shows the electrode support of FIG. 1 with the conductor paths applied in the second operation.

One method of producing an electrode support such as shown in FIG. 1 proceeds in the following manner:

First of all a mask whose cutouts correspond to the structure of the conductor paths 1 and the electrodes 2, 2', as shown in FIG. 2, is placed on the electrode support. The conductor paths 1 and the electrodes 2, 2', as shown in FIG. 2, are then applied to the electrode support by the vapor deposition of a transparent conductive material in a vacuum chamber.

Thereupon the mask is removed and a second mask whose cutouts have the structure of the conductor paths 1' is placed on the electrode support. The conductor tracks 1' are now applied to the electrode support also by vapor deposition in a vacuum chamber. In this second operation, however, a solderable material is applied by vapor deposition so that later on the terminals of the chips of the integrated circuits which are applied to the electrode support can be connected by soldering to the conductor paths 1' associated with them. In order that the individual parts of the mask for the application of the conductor paths 1' do not become unstable in shape due to their U-shaped formation, but remain self-supporting and mechanically stable in their plane, the cutouts of the mask are interrupted at several points by support webs which lead to interruptions 4 in the applied conductor paths 1'.

Since, however, bridging paths 5 were already applied in the first operation together with the conductor paths 1 to the electrode support at the places where the conductor paths 1' are interrupted in this second operation, the interruptions 4 are bridged over. Problems which might result due to an unstable shape of the mask, with respect to the conductor paths 1' are avoided by the support webs in the case of the second mask.

Alternatively, the foregoing two masking steps may be done in reversed order, in which case the bridging paths 5 would be set in place after the interruptions 4 are first formed.

Figure 4:
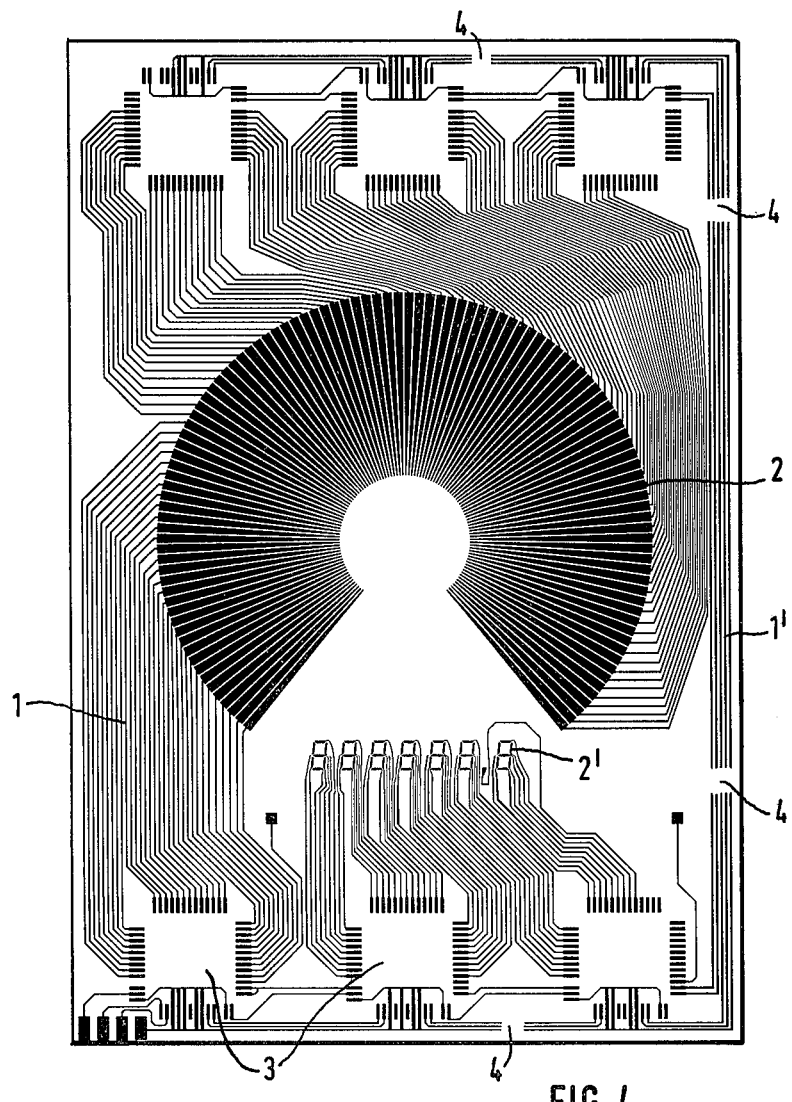
FIG. 4 shows an electrode support for a liquid-crystal display with completely applied conductor paths which have interruptions which are to be bridged by soldering.

A second possibility in accordance with the invention of producing the electrode support shown in FIG. 1 resides in applying to the electrode support a mask which has the cutouts corresponding to the conductor paths 1, 1' as well as of the electrodes 2, 2' shown in FIG. 4. In order to maintain the shape of the conductor paths 1' stable, the mask is provided at different places with support webs which then lead to interruptions 4 in the conductor tracks 1'. In this method also the conductor paths 1 and 1' and the electrodes 2, 2' are applied in a first operation to the electrode support by, for instance, the vapor deposition of transparent, electrically conductive material in a vacuum chamber.

This first mask remains applied on the electrode support for the next operation. In addition a covering is now also placed over the mask so that now only the conductor paths 1' in the edge region of the electrode support are visible.

A layer of solderable electrically conductive material is now applied also by vapor deposition onto the conductor paths 1' which are already present.

After removal of the covering and of the mask the interruptions 4' can now be bridged over by soldering. At the same time the lead lines of the integrated circuits 3 which are now applied in the form of chips to the electrode support can also be connected by soldering to the corresponding conductor tracks 1'.

When installing the electrode supports produced by the above method into liquid crystal displays one preferably proceeds in the manner that the electrode supports bearing the conductor paths 1 and 1' are completed before the application of the integrated circuits 3 and the soldering work. Thereupon the electrode supports which are formed as glass plates are assembled to form a cell, filled with liquid-crystal substance and closed. Since the electrode support on which the conductor paths 1' are arranged is larger than the other electrode support, the conductor paths 1' remain outside the cell so that now the integrated circuits can be applied and the soldering work at the interruptions 4 and at the connections of the conductor paths 1' to the corresponding contacts of the integrated circuits can be carried out. The use of different materials for the conductor paths 1 and 1' is due to the fact that the conductor paths 1 are to be transparent for a liquid-crystal display and the conductor paths 1' are to be solderable, while the material for the conductor paths 1 is, however, not solderable and the material for the conductor paths 1' is not transparent. Since the conductor paths 1', however, are not in the field of vision of the person observing the liquid-crystal display, they do not have to be transparent.

Herein the term "cutouts" is not limited to any particular form of manufacture of same, but is used in its broadest sense as openings formed in the mask.

In FIGS. 5 and 6 there are two glass plates 6 and 7 which are spaced from each other and form a chamber 8 therebetween. This chamber 8 is filled with a liquid-crystal substance. The inner sides of the plates 6 and 7, respectively, are provided with the conducting tracks 1' and electrodes 2, 2', and 2", 2''', respectively.

The chamber 8 has a filling opening 9 for the introduction of the liquid crystal substance. This filling opening 9 is closed after the chamber 8 is filled with the liquid crystal substance. An interruption 4 in the conductor tracks 1' is located at the position of the filling opening 9 and is to be bridged over by the filling opening closure 10 of electrically conductive material.

While there have been disclosed embodiments of the invention it is to be understood that these embodiments are given by example only and not in a limiting sense.

We claim:

1. In a method of producing conductor tracks applied to a support, particularly conductor tracks applied on an electrode support of a liquid-crystal display, in which a mask having openings corresponding to the conductor tracks is placed on the support and a conductive layer of electrically conductive material is applied through said openings to the support corresponding to the openings, the improvement comprising the steps of
forming the mask with openings disposed partially along paths corresponding to said conductor tracks to be produced leaving interruptions at given points along said paths formed by support webs in the mask which serve as said interruptions and provide a mechanically stable shape to said mask in its plane for strengthening the mask against deformation,
partially forming the conductor tracks on the support with interruptions in the conductor tracks masked by the support webs in a first operation by applying the conductive layer of electrically conductive material through the openings of the mask onto the support, and
in a second operation, bridging the interruptions in the conductor tracks on the support by applying additional electrically conductive material in the interruptions.

2. The method as set forth in claim 1, further comprising the steps of
removing the mask having the openings corresponding to the conductor tracks in the second operation and placing on the support a mask having second openings at the places of the interruptions of the conductor tracks on the support and applying the additional electrically conductive material therethrough.

3. A method of producing conductor tracks on a support comprising the steps of
in a first operation applying a non-solderable conductive layer of electrically conductive material to the support via a mask having first openings and support webs therebetween so as to form conductor tracks with interruptions on the support,
then in a second operation placing on the mask which is still on the support a covering having second openings which leave open areas of the conductor tracks on both sides of the support webs on the mask, and applying a layer of solderable material onto the open areas through said second openings in the covering and the first openings in the masks,
removing the mask and covering and thereafter, connecting the interruptions together with one another in an electrically conductive manner by soldering.

4. The method as set forth in claim 3, by which terminals of at least one integrated circuit are connected to the conductor tracks, wherein
said second openings in the covering leave open areas on the conductor tracks to which the terminals are to be connected,
applying the integrated circuit onto the support after the second operation, and
connecting said open areas of the conductor tracks to the terminals of the integrated circuit in an electrically conductive manner by soldering to associated of the conductor tracks.

5. The method according to claim 1 further comprising the steps of
assembling two of said electrode supports of a liquid-crystal display with the supports spaced apart and on which supports there are arranged, opposite each other, electrodes coordinated to each other,
connecting the electrodes upon assembly of the electrode supports having thereon said conductor tracks in an electrically conductive manner with each other at a contact point by the steps comprising
positioning the bridged over interruptions in the conductor tracks at places of the contact points, and
producing the contact points by applying conductive material in a thickness which corresponds to the spacing between the two electrode supports.

6. The method according to claim 5, wherein
the contact point is made of an electrically conductive cement.

7. The method according to claim 1, further comprising the steps of
arranging two of the supports constituting two glass plates of a liquid-crystal display spaced apart from each other so as to form a chamber therebetween, the facing insides of said plates being provided with the conductor tracks and forming the electrode supports, and the chamber having a filling opening for the introduction therethrough of a liquid-crystal substance, the opening being closed after the filling,
arranging the interruptions of the conductor tracks at the position of the filling opening and
the step of bridging over the interruptions is performed by closing the filling opening with the additionally electrically conductive material.

8. The method according to claim 5 or 7, in which the conductor tracks are arranged on the electrode supports of the liquid-crystal display, further comprising the step of
arranging integrated circuits and/or the interruptions in an uncovered edge region of the electrode supports, one of the two electrode supports being smaller than the other, the uncovered edge region being formed by overlapping the smaller electrode support.

9. The method of producing conductor tracks on an electrode support of a liquid-crystal display, comprising the steps of
a first operation for the deposition of material via openings in a mask comprising:
placing a mask onto the electrode support, said mask having first openings corresponding to the structure of some of the conductor tracks to connect terminals on said support and to bridge portions of other of the conductor tracks to be formed on the electrode support;

applying a transparent electrically conductive material to the electrode support through the openings;
a second operation comprising:
removing the mask from the electrode support and placing thereon another mask having second openings corresponding to the structure of the other of the conductor tracks as well as having support webs between the first openings corresponding to the bridge portions;
applying a solderable conductor material through the second openings of the another mask onto the electrode support forming the other of the conductor tracks up to the bridge portions.

10. The method of producing conductor tracks on an electrode support of a liquid-crystal display as set forth in claim 9, wherein
said other conductor tracks are U shaped rings extending along three adjacent edges of the support.

11. The method according to claim 9, further comprising the steps of
connecting terminals of chips of integrated circuits to associated of the other conductor tracks by soldering contact terminals of the integrated circuits to the associated of the other conductor tracks.

12. The method as set forth in claim 9, further comprising the steps of
applying solder to the bridge portions on the electrode support connecting with the solderable material applied in the second operation.

13. A method of producing conductor tracks applied to an electrode support of a liquid-crystal indicator display, comprising the steps of
placing a mask on the electrode support having first openings corresponding to all the conductor tracks and terminals to be formed on the electrode support, the mask having support webs corresponding to interruptions along some of the conductor tracks to be formed on the electrode support,
applying a transparent electrically conductive material to said mask through said first openings to form said conductive tracks and terminals on the electrode support,
keeping the mask on the electrode support and placing a covering on the mask having second openings such that only said same conductor tracks are visible and open therethrough,
applying a solderable electrically conductive material through said second opening through the covering onto said some conductor tracks,
removing the mask and covering,
bridging over the interruptions in said some conductor tracks by soldering to complete said some conductor tracks.

14. A method according to claim 13, further comprising the step of
conducting lead lines of integrated circuits by soldering to said some conductor tracks.

15. The method according to claim 14, wherein
the electrode support has an uncovered edge on which lie said some conductor tracks.

16. The method according to claim 13, wherein
said some conductor tracks are U shaped rings extending along three adjacent edges of the support.

* * * * *